US 8,867,211 B2

(12) United States Patent
Wiltzius

(10) Patent No.: US 8,867,211 B2
(45) Date of Patent: Oct. 21, 2014

(54) MOUNTING A HEAT SINK MODULE

(75) Inventor: Andrew L. Wiltzius, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 237 days.

(21) Appl. No.: 13/425,469

(22) Filed: Mar. 21, 2012

(65) Prior Publication Data

US 2013/0248146 A1    Sep. 26, 2013

(51) Int. Cl.
    *H05K 7/20*    (2006.01)

(52) U.S. Cl.
    USPC ........... 361/704; 361/718; 361/719; 257/718; 165/80.3; 24/453; 24/458

(58) Field of Classification Search
    None
    See application file for complete search history.

(56) References Cited

U.S. PATENT DOCUMENTS

| | | | |
|---|---|---|---|
| 7,099,156 B2* | 8/2006 | Chen et al. | 361/719 |
| 7,180,743 B2* | 2/2007 | Chen et al. | 361/704 |
| 7,344,345 B2* | 3/2008 | Aukzemas | 411/372 |
| 7,405,939 B2* | 7/2008 | Yang | 361/719 |
| 7,480,144 B2* | 1/2009 | Li | 361/704 |
| 7,480,146 B2 | 1/2009 | Coleman | |
| 7,606,031 B2* | 10/2009 | Hsieh et al. | 361/700 |
| 7,637,310 B2* | 12/2009 | Li et al. | 165/80.3 |
| 7,652,886 B2* | 1/2010 | Li et al. | 361/719 |
| 7,817,427 B2* | 10/2010 | Li et al. | 361/719 |
| 7,869,217 B2* | 1/2011 | Chen et al. | 361/710 |
| 8,245,766 B2* | 8/2012 | Cao et al. | 165/121 |
| 2004/0118584 A1 | 6/2004 | Franz | |
| 2005/0094366 A1 | 5/2005 | Lewis | |
| 2005/0160592 A1 | 7/2005 | Eckblad | |
| 2005/0195572 A1 | 9/2005 | Franz | |
| 2009/0034200 A1* | 2/2009 | Li et al. | 361/704 |
| 2009/0217496 A1 | 9/2009 | Lin | |
| 2011/0044008 A1 | 2/2011 | Barina | |

* cited by examiner

*Primary Examiner* — Boris Chervinsky

(57) ABSTRACT

A heat sink module has a leg for tool-less engagement with a mounting structure on a circuit board. Engagement of the heat sink module with the mounting structure is to cause thermal contact between the heat sink module and a heat generating device.

16 Claims, 6 Drawing Sheets

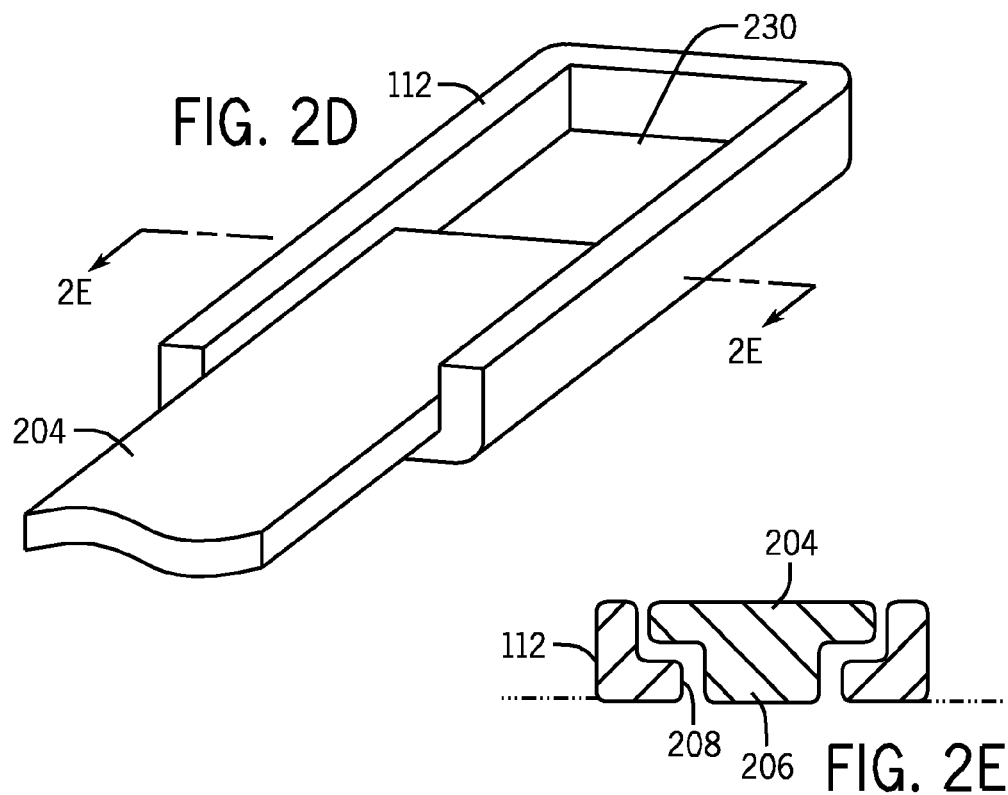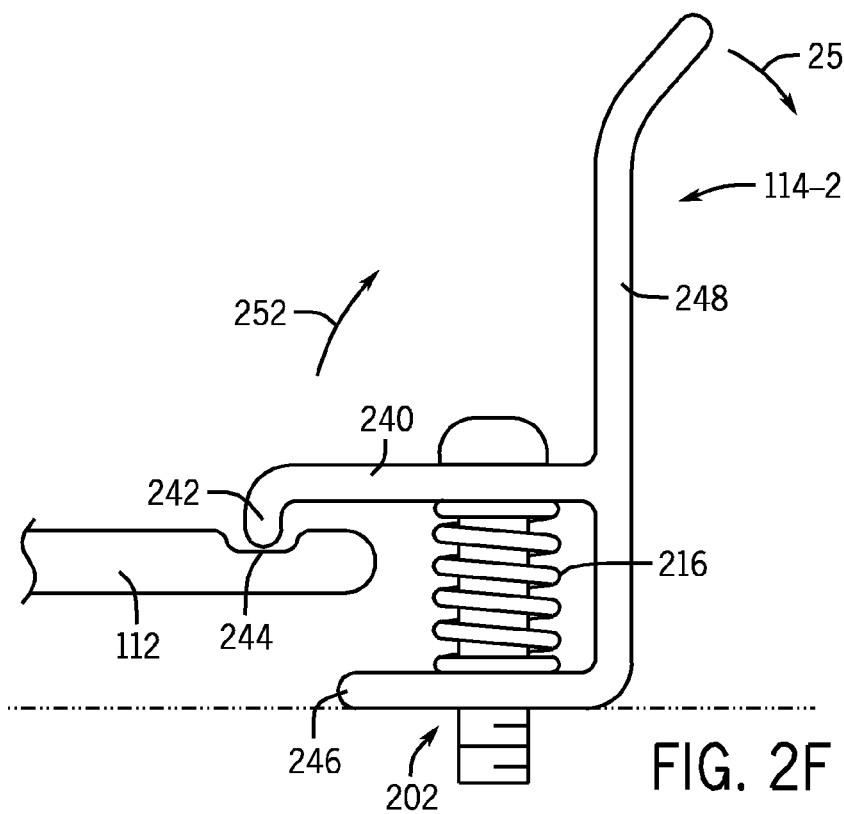

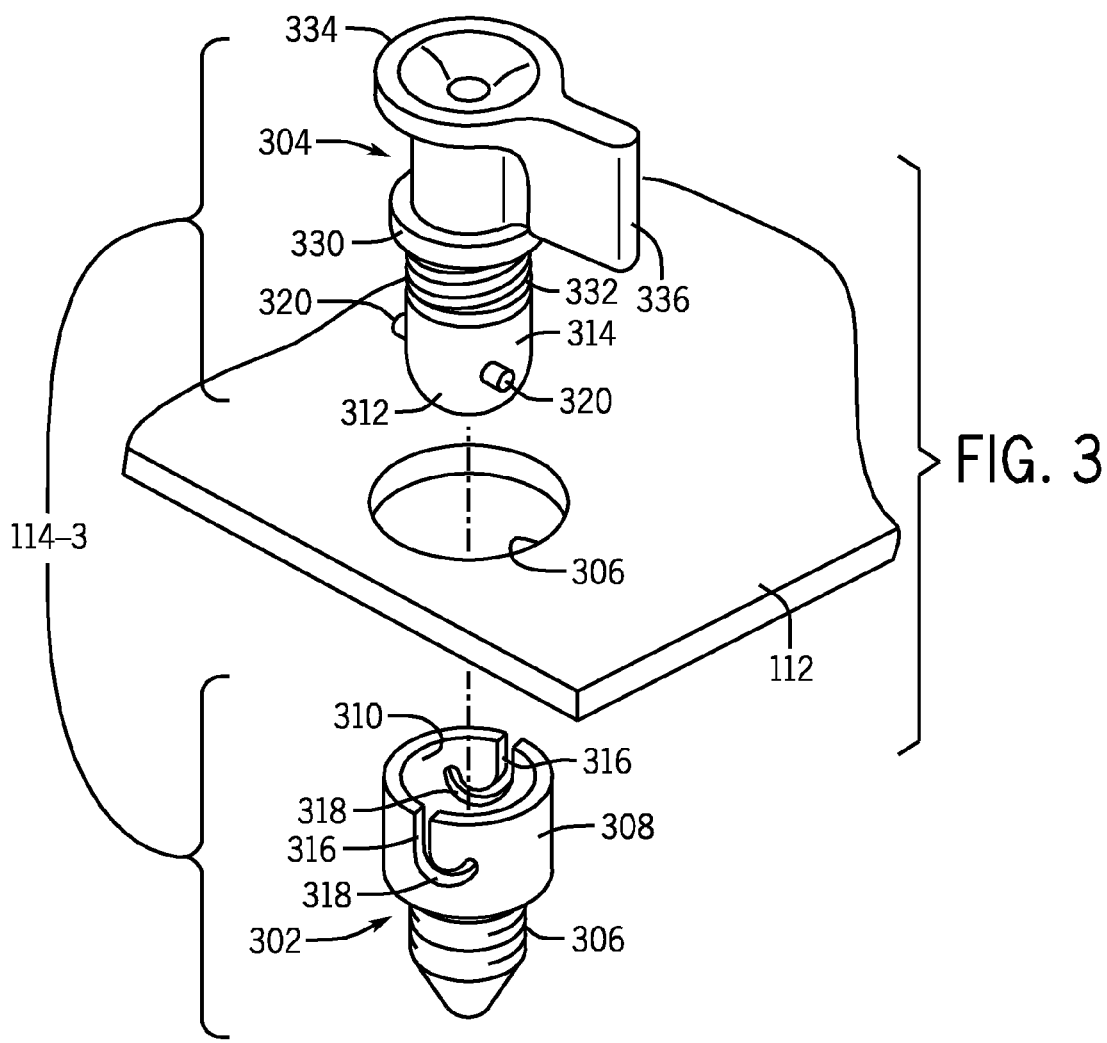
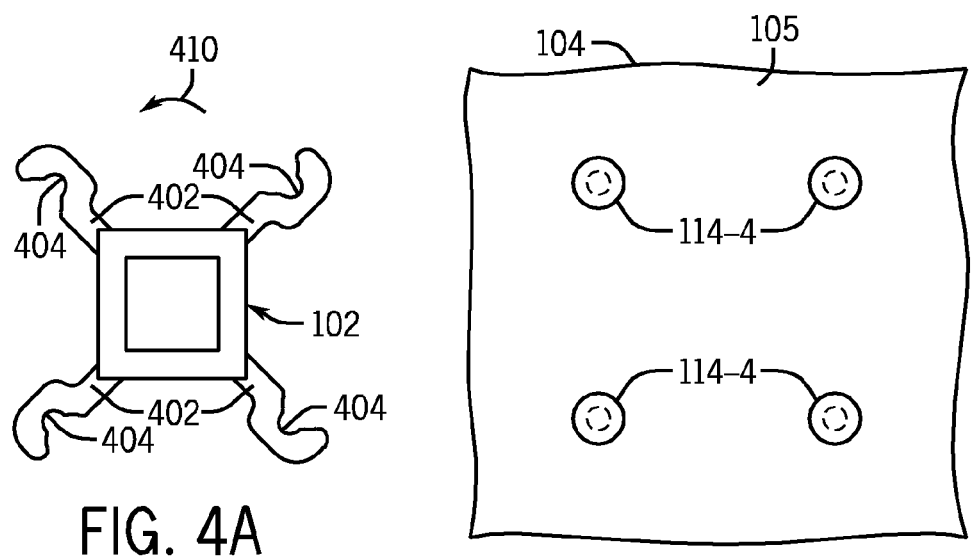
FIG. 4A
FIG. 4B

MOUNTING A HEAT SINK MODULE

BACKGROUND

A system (e.g. a computer system, a storage system, a communication system, etc.) can include various operational components that can generate heat during operation. To provide thermal management in the system, heat sinks can be used, where a heat sink has one or multiple heat dissipation elements (e.g. heat fins, a fan, etc.).

BRIEF DESCRIPTION OF THE DRAWINGS

Some embodiments are described with respect to the following figures:

FIGS. 2A-2F are various views of components used in an arrangement that includes a heat sink module and a mounting structure to attach the heat sink module to a circuit board, according to some implementations;

FIGS. 3-5B are views of example arrangements including mounting structures for attaching a heat sink module, in accordance with other implementations.

DETAILED DESCRIPTION

Traditionally, to attach a heat sink module to a heat generating device (e.g. microprocessor, microcontroller, input/output device, memory device, etc.), a tool is used. One such tool is a screwdriver or a nut driver that is used to drive a fastener (e.g. a screw) for attaching the heat sink module to a circuit board. However, using a tool for installing a heat sink module increases the complexity of performing the installation and the time for assembling a system that includes the heat sink module. For example, installing the heat sink module may be performed at an assembly site, or even at a user's site, where the appropriate tool may not be readily accessible. Also, a person performing the installation of the heat sink module may not have sufficient expertise to properly perform the installation using the tool.

In accordance with some implementations, a tool-less attachment mechanism is provided for attaching a heat sink module with respect to a heat generating device on a circuit board. A heat sink module can include one or multiple heat dissipation elements. As examples, heat dissipation elements can include heat radiation elements (e.g. heat fins that increase the surface area from which thermal radiation can occur), an airflow generator (e.g. a fan), a heat pipe (which is a conduit containing a fluid to transfer heat from one side of the heat pipe to another side of the heat pipe), and/or other heat dissipation elements.

Figure 1:
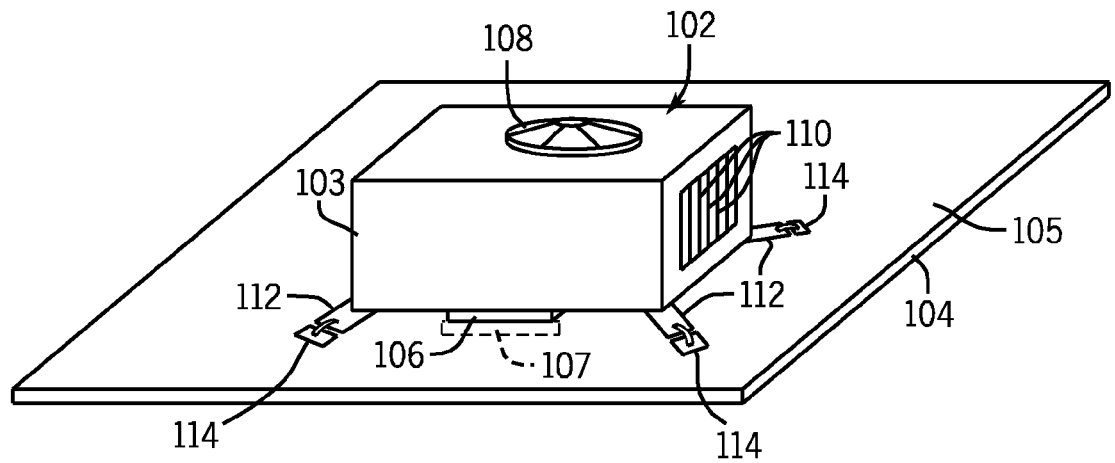
FIG. 1 is a schematic diagram of an example system incorporating some implementations.

FIG. 1 is a schematic diagram of an example arrangement that includes a heat sink module 102 that is mounted with respect to a circuit board 104. A "circuit board" refers to a supporting structure on which electronic devices (e.g. microprocessors, memory devices, input/output devices, etc.) can be provided. One such electronic device is represented as 106 in FIG. 1. The electronic device 106 is an example of a heat generating device. In other examples, other types of heat generating devices may be provided on the circuit board 104.

An electronic device can be directly attached to a surface 105 of the circuit board 104, such as by use of soldering or other attachment techniques. Alternatively, an electronic device can be inserted into a socket (represented by dashed profile 107 in FIG. 1), which physically and electrically connects the electronic device to the circuit board 104. A socket has physical elements for receiving the electronic device, as well as electrical contacts for electrically contacting input/output pins of the electronic device to electrical circuits of the circuit board 104.

The circuit board 104 can include one or multiple layers of electrically conductive traces to route electrical signals between different parts of the circuit board 104. These electrically conductive traces can be electrically connected to input/output pins of electronic devices mounted on the circuit board 104.

As shown in FIG. 1, the heat sink module 102 is provided over the electronic device 106, which is provided on the circuit board 104. An electronic device provided or mounted "on" a circuit board can refer to the electronic device being directly attached (such as by soldering) to the surface 105 of the circuit board 104, or to the electronic device being mounted on the circuit board 104 by use of a socket. The socket is physically and electrically attached to the surface 105 of the circuit board 104.

When installed, the heat sink module 102 can be thermally contacted to an upper surface of the electronic device 106, to allow heat produced by the electronic device 106 to be thermally communicated to the heat sink module 102 for dissipation by the heat sink module 102. The heat sink module 102 has a heat sink body 103, which can be formed of a thermally conductive material. In some examples, the heat sink module 106 can include an airflow generator 108 (e.g. a fan) mounted in the heat sink body 103. The airflow generator 108 when activated generates an airflow to carry heat away from the heat sink module 102. The heat sink module 102 can also include various heat radiation elements (e.g. heat fins) to add surface area from which heat of the heat sink module 102 can radiate. In some examples, the airflow generated by the airflow generator 108 passes through channels between the heat dissipation elements 110 to increase heat dissipation from the heat dissipation elements 110.

In accordance with some implementations, the heat sink module 102 has legs 112 to allow for the heat sink module 102 to be mounted in a tool-less manner with respect to the electronic device 106 and the circuit board 104. Mounting the heat sink module 102 in a "tool-less" manner with respect to the electronic device 106 and the circuit board 104 refers to the ability to securely mount the heat sink module 102 with respect to the electronic device 106 and the circuit board 104 without the use of any tool. The legs 112 (or at least portions of the legs 112) protrude laterally outwardly from the sides of the body of the heat sink module 102. The legs 112 can be attached to the heat sink body 103 (by some fastening mechanism) or the legs 112 can be integrally formed with the heat sink body 103.

Mounting structures 114 are provided on the circuit board 104. The mounting structures 114 are affixed to the circuit board 104 by an attachment mechanism (which can include screws or other types of fasteners). To perform tool-less installation of the heat sink module 102, the legs 112 of the heat sink module 102 are engaged to the mounting structures 114, without use of a tool. The legs 112 have respective engagement features (discussed in further detail below) for tool-less engagement with the mounting structures 114.

The engagement of the engagement features of the legs 112 with the mounting structures 114 causes the heat sink module 102 to make thermal contact with the electronic device 106, and also secures the heat sink module 102 against the circuit board 104.

Figure 2A:
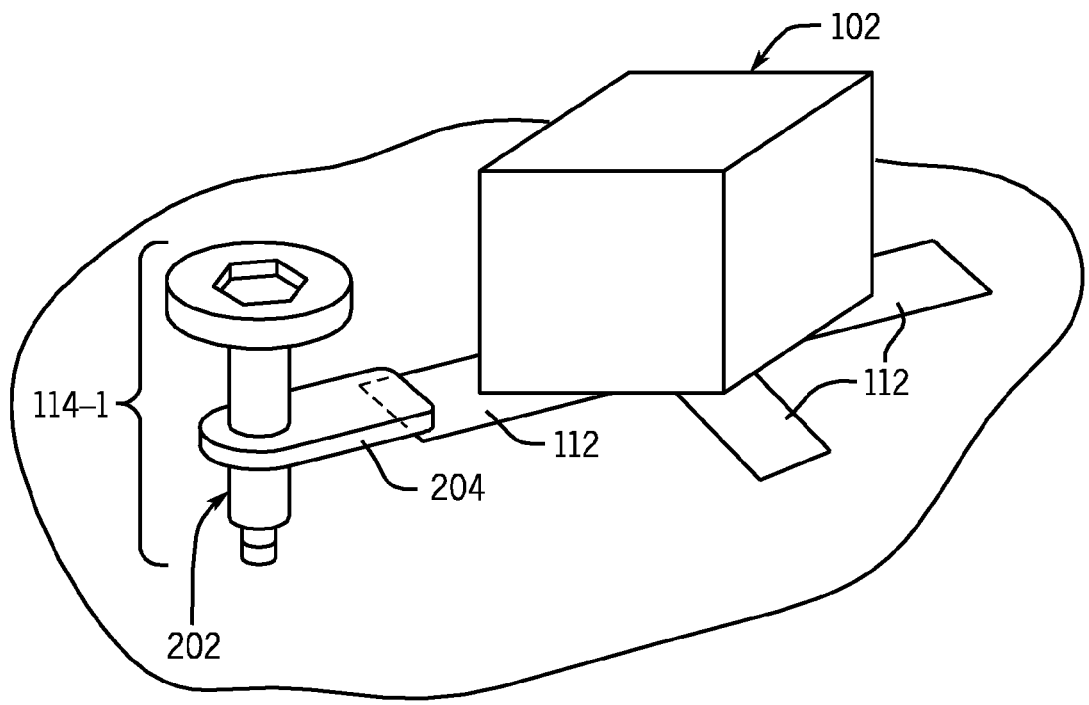

FIG. 2A illustrates an example arrangement that includes a mounting structure 114-1 according to some implementations. The mounting structure 114-1 constitutes one type of the mounting structure 114 discussed above in connection with FIG. 1. Although just one mounting structure 114-1 is shown in FIG. 2A, it is noted that additional mounting structures 114-1 would be provided to engage to other corresponding legs 112 of the heat sink module 102.

The mounting structure 114-1 can include a screw 202 (or other type of fastener) and an engagement tab 204 that is pivotably attached to the screw 202. The engagement tab 204 is able to pivot with respect to the screw 202 to allow for the engagement tab 204 to be moved between a first position and a second position. In the first position, the engagement tab 204 engages an engagement feature of a corresponding leg 112. In this first position, the engagement tab 204 securely holds the heat sink module 102 to the circuit board 104 of FIG. 1. In the second position, the engagement tab 204 allows for tool-less installation or de-installation of the heat sink module 102 with respect to the electronic device 106. Effectively, in the second position, the engagement tab 204 is released from the leg 112 of the heat sink module 102.

Figure 2B:
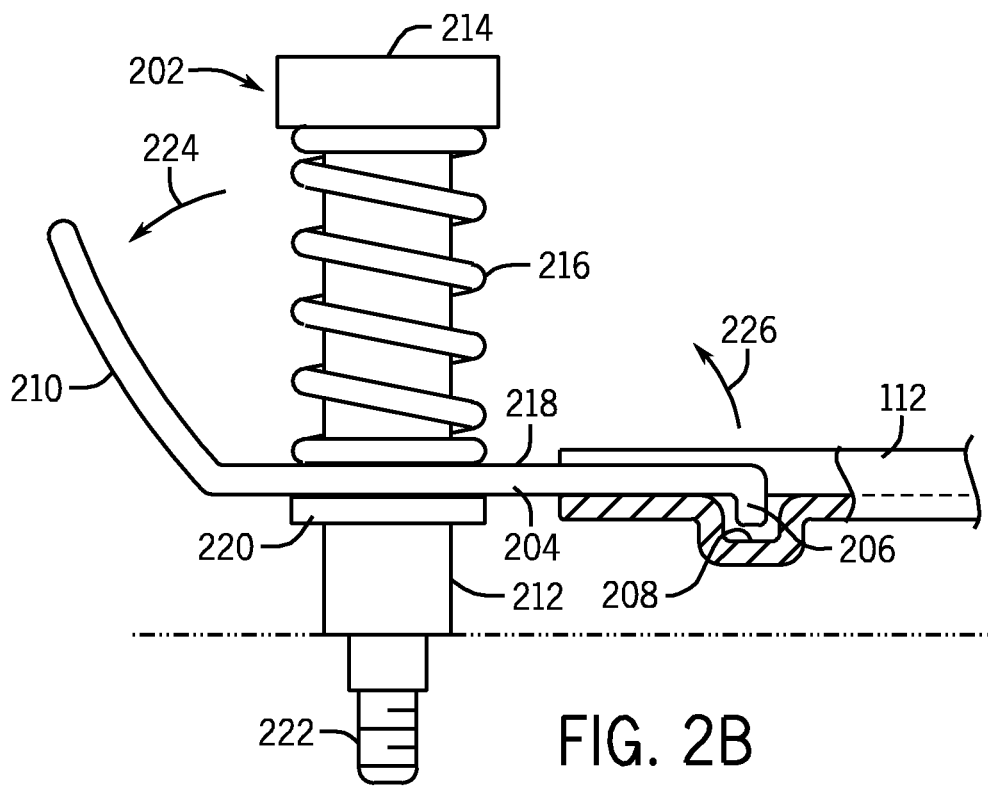

FIG. 2B is a side sectional view of the mounting structure 114-1 and leg 112 of FIG. 2A. The engagement tab 204 of the mounting structure 114-1 is shown in its first position in FIG. 2B. The engagement tab 204 has an engagement head 206 that can be received in a receiving profile 208 of the leg 112. The engagement head 206 is provided on one end of the engagement tab 204. A user-actuatable lever 210 is provided on the other end of the engagement tab 204.

Figure 2C:
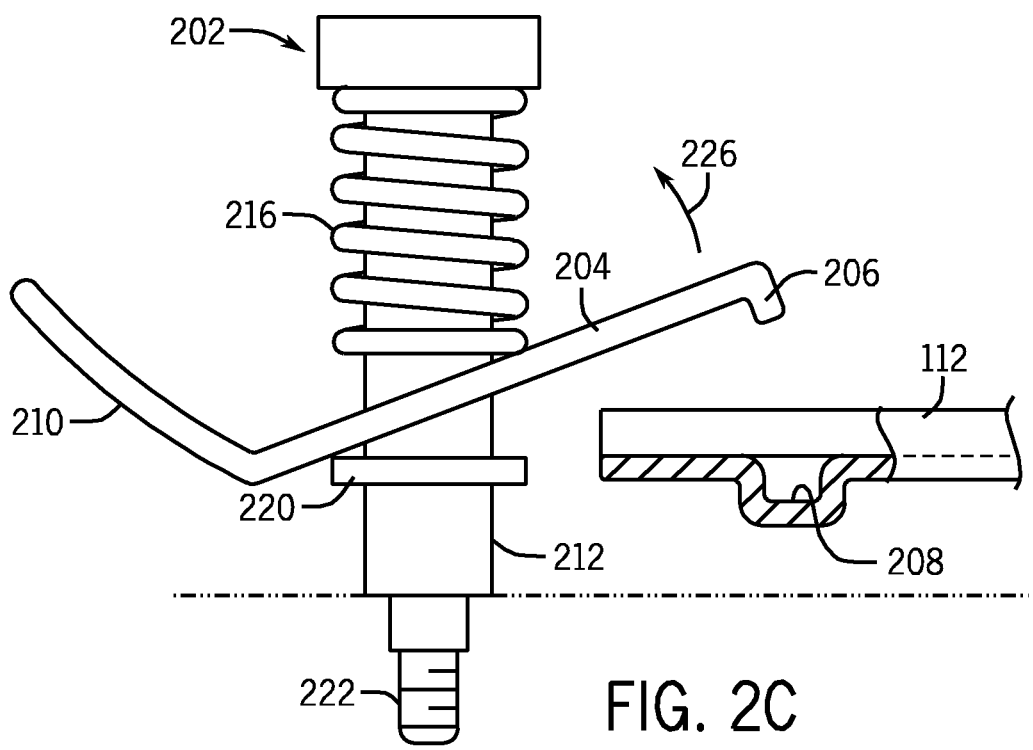

The engagement tab 204 is pivotably mounted with respect to a body 212 of the screw 202. Such pivotal mounting allows the engagement tab 204 to pivot from its first position depicted in FIG. 2B along a direction of path 226. FIG. 2C shows pivoting of the engagement tab 204 along the path 226.

The screw 202 has a screw head 214. A spring 216 (or other type of biasing element) is provided around a portion of the screw body 212. The spring 216 is provided between a bottom of the screw head 214 and an upper surface 218 of the engagement tab 204. The spring 216 applies a biasing force to maintain the engagement tab 204 in the first position depicted in FIG. 2B—in other words, the spring 216 applies a biasing force to maintain the engagement tab 204 generally horizontal in the view of FIG. 2B, such that the engagement tab 204 is engaged to the heat sink module leg 112.

A retaining element 220 is provided around the screw body 212 below the engagement tab 204 to maintain the position of the engagement tab 204 with respect to the screw body 212. The retaining element 220 can be a C-clip, washer, or other type of element for retaining the engagement tab 204 on the screw body 212.

As further shown in FIG. 2B, a lower portion of the screw 202 includes a threaded portion 222 to allow the screw 202 to be screwed into a screw receptacle on the circuit board 104 of FIG. 1. The screw receptacle can be provided in the surface 105 (FIG. 1) of the circuit board 104, or alternatively, the screw receptacle can be provided on the socket that receives the electronic device 106.

As shown in FIG. 2B, the user-actuatable lever 210 of the engagement tab 204 can be pressed by a user in a direction indicated by path 224. Pressing the lever 210 along path 224 causes the engagement tab 204 to pivot about the screw body 212 such that the engagement head 206 of the engagement tab 204 is lifted along path 226. Lifting of the engagement head 206 to its second position allows for installation or de-installation of the heat sink module 102 with respect to the electronic device 106.

During the installation process, a user presses the lever 210 to actuate the engagement tab 204 to its second position. Once the engagement tab 204 is at its second position, a leg 112 of the heat sink module 102 can be positioned underneath the engagement tab 204. Once the heat sink module leg 112 is so positioned, the user can release the lever 210, which allows the engagement tab 204 to return to its first position due to the biasing force applied by the spring 216. At this point, the engagement head 206 of the engagement tab 204 can engage the receiving profile 208 of the heat sink module leg 112.

Note that the screw 202 can be screwed into a screw receptacle on the circuit board 104 using either a screwdriver (or other tool), or using the fingers of a user. Although the mounting structure 114-1 including the screw 202 can be attached to the circuit board 104 using a tool, it is noted that the installation or de-installation of the heat sink module 102 with respect to the mounting structure 114-1 is performed in a tool-less manner due to the ability to actuate the engagement tab 204 between different positions by use of the user-actuatable lever 210.

FIG. 2D is a perspective view of a portion of the heat sink module leg 112 and engagement tab 204 of FIGS. 2A and 2B. The leg 112 has an engagement feature in the form of a receptacle 230 in which the engagement tab 204 can be received when the engagement tab 204 is in the first position (shown in FIG. 2B). When the lever 210 of FIG. 2B is pressed by a user, the engagement tab 204 is lifted away from the receptacle 230 of the leg 112 to its second position.

FIG. 2E is a front sectional view of the leg 112 and engagement tab 204 of FIG. 2D (along section 2E-2E). The front sectional view of FIG. 2E shows the engagement head 206 of the engagement tab 204 received in a receiving profile 208 (e.g. a slot) of the leg 112. As shown in FIG. 2E, the main body of the engagement tab 204 sits in the receptacle 230 of the leg 112.

FIG. 2F shows a mounting structure 114-2 according to alternative implementations. The mounting structure 114-2 includes the screw 202. However, instead of use of the engagement tab 204 of FIG. 2B, the mounting structure 114-2 has an engagement tab 240 with an engagement head 240 to engage a receiving profile 244 of the heat sink module leg 112. In addition, the mounting structure 114-2 has a support member 246. The spring 216 that is mounted around the screw body is provided between the lower surface of the engagement tab 240 and the upper surface of the support member 246. The screw 202 passes through openings in the engagement tab 240 and the support member 246.

The engagement tab 240 and support member 246 are pivotably mounted with respect to the screw body. The mounting structure 114-2 has a user-actuatable lever 248 that is integrally or otherwise attached to the engagement tab 240 and the support member 246. Movement of the lever 248 along a path 250 causes the engagement tab 240 to be lifted in a direction indicated by path 252, to cause the engagement tab 240 to be moved from a first position (where it can be securely engaged to the heat sink module leg 112) to a second position (where the engagement tab 240 is lifted to a disengaged position such that the heat sink module 102 can be installed or de-installed).

FIG. 3 illustrates a different example arrangement according to alternative implementations. A mounting structure 114-3 of FIG. 3 includes a retention component 302 and a screw 304 (or other fastener) that is to be attached to the retention component 302. The screw 304 is shaped to pass through an opening 306 of the heat sink module leg 112. In examples according to FIG. 3, the opening 306 is considered the engagement feature of the leg 112 that is to be engaged to the mounting structure 114-3.

The retention component 302 has a threaded portion 306 at its lower part, where the threaded portion 306 is for threaded connection to a thread profile in the circuit board 104 or a thread profile in a socket to receive the electronic device 106. The upper part of the retention component 302 includes a receptacle structure 308 that has a receptacle 310 to receive a lower part 312 of a screw body 314. In addition, the receptacle structure 308 has retention slots 316 formed in the body of the receptacle structure 308. The retention slots 316 can be J-slots, each having a respective curved lower portion 318.

In examples according to FIG. 3, the receptacle structure 308 has a generally cylindrical shape—in other examples, the receptacle structure 308 can have a different profile shape, such as a rectangular cross-sectional shape or other shape.

A retention pin 320 is provided through the screw body 314 near the lower portion 312 of the screw 304. The retention pin 320 is arranged to be passed into the retention slots 316. Once the retention pin 320 reaches the curved portions 318 of the retention slots 316, rotation of the screw 304 (e.g. counter-clockwise rotation) causes the retention pin 320 to travel along the curved portions 318 to reach a locked position at the ends of the curved portions 318.

A spring 332 or other biasing element is provided below an engagement flange 330 of the screw 304. The engagement flange 330 is to engage the upper surface of the leg 112 after the screw 304 has passed through the opening 306.

Once the retention pin 320 of the screw 304 reaches the ends of the curved portions 318, the biasing force applied by the spring 332 keeps the retention pin 320 in position to secure the screw 304 with respect to the retention component 302.

A screw head 334 of the screw 304 has a handle 336 that can be actuated by a user to rotate the screw 304. Alternatively, the screw head 334 can be provided with a profile to be engaged by a user's finger to cause rotation of the screw 304.

FIG. 4A is an upper view of an example arrangement according to further alternative implementations. In FIG. 4A, the heat sink module 102 has legs 402, where each leg 402 has a corresponding engagement slot 404. The engagement slots 404 are to engage mounting structures 114-4 provided on the circuit board 104, as shown in FIG. 4B. The heat sink module 102 is rotatable (along path 410) about a vertical axis (which is perpendicular to the page of FIG. 4A) to allow the engagement slots 404 to engage the mounting structures 114-4.

The mounting structures 114-4 can include pins that are threadably connected to thread profiles in the surface 105 of the circuit board 104, or in a socket on the circuit board 104.

Figure 5A:
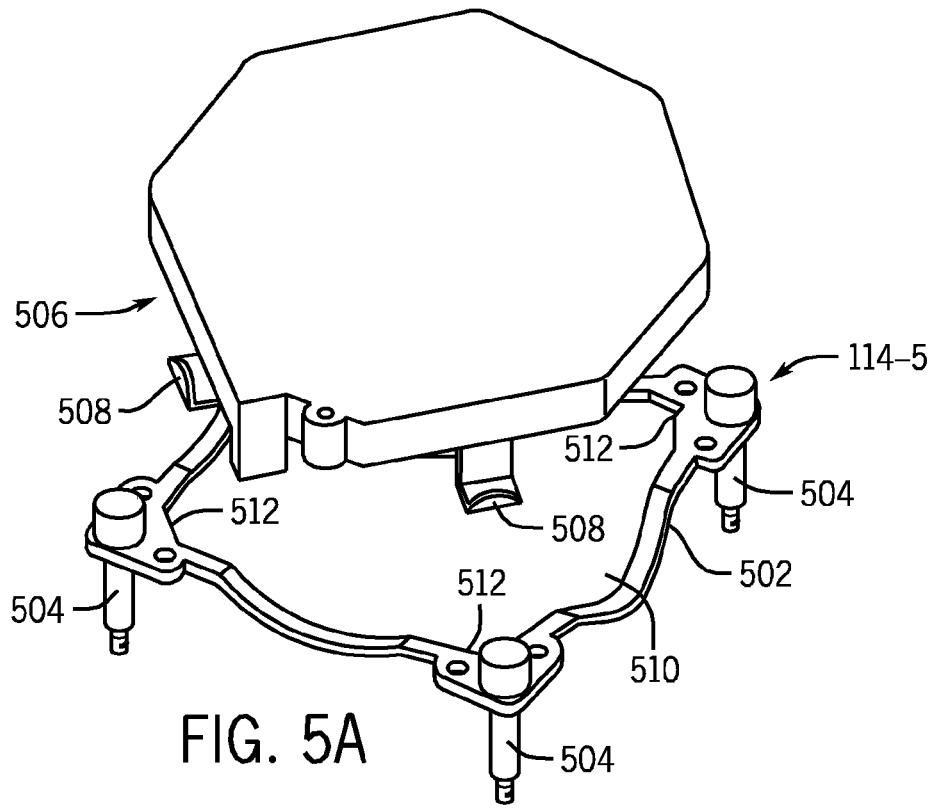
Figure 5B:
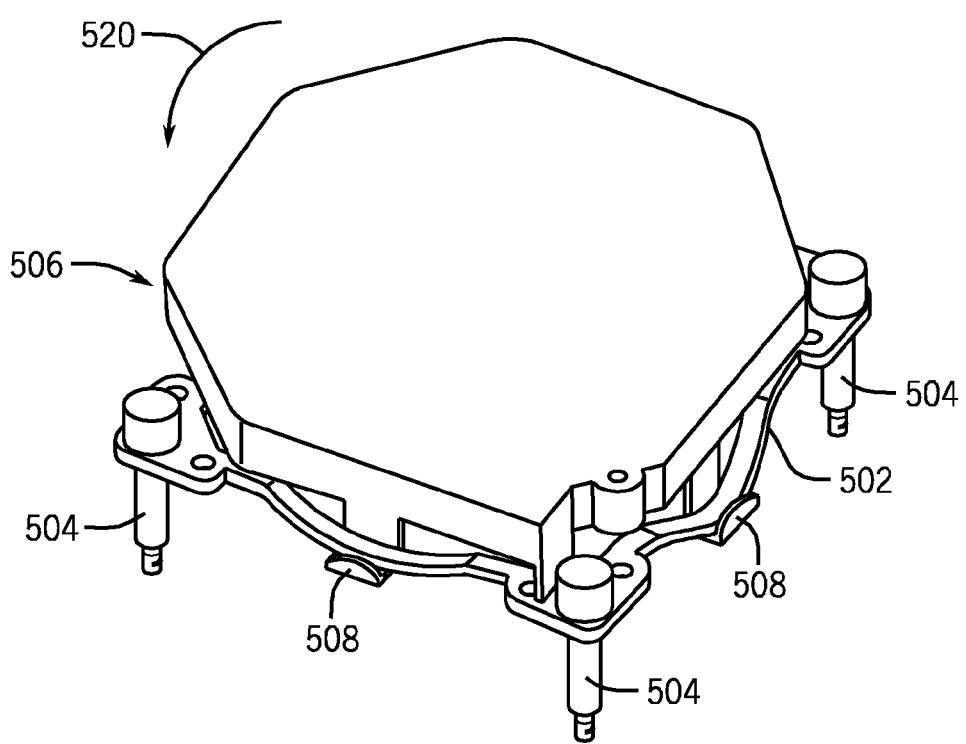

FIGS. 5A-5B illustrate an example arrangement according to further implementations. In FIG. 5A, a mounting structure 114-5 has a bracket 502 and screws 504 (or other fasteners) that are provided through openings of the bracket 502. The screws 504 are used to attach the bracket 502 on the circuit board 104.

A heat sink module 506 has legs 508 to engage the bracket 502. To fit the legs 508 of the heat sink module 506 through the opening 510 of the bracket 502, the heat sink module 506 is rotated to a position where the legs 508 are aligned with channels 512 of the bracket 502 that are adjacent the screws 504.

In this position of the heat sink module 506, the legs 508 can pass through the channels 512 such that a portion of the heat sink module 506 can fit through the opening 510 of the bracket 502, to allow the legs 508 to be positioned below the bracket 502, as shown in FIG. 5B. Once the legs 508 are positioned below the bracket 502, the heat sink module 506 is rotated along the path 520 (FIG. 5B), which causes the legs 508 to engage respective portions of the bracket 502, as depicted in FIG. 5B. This causes the heat sink module 506 to be securely engaged with respect to the bracket 502 (in a tool-less manner), such that the heat sink module 506 is thermally contacted to the electronic device 106 and is secured against the circuit board 104 of FIG. 1.

Figure 6:
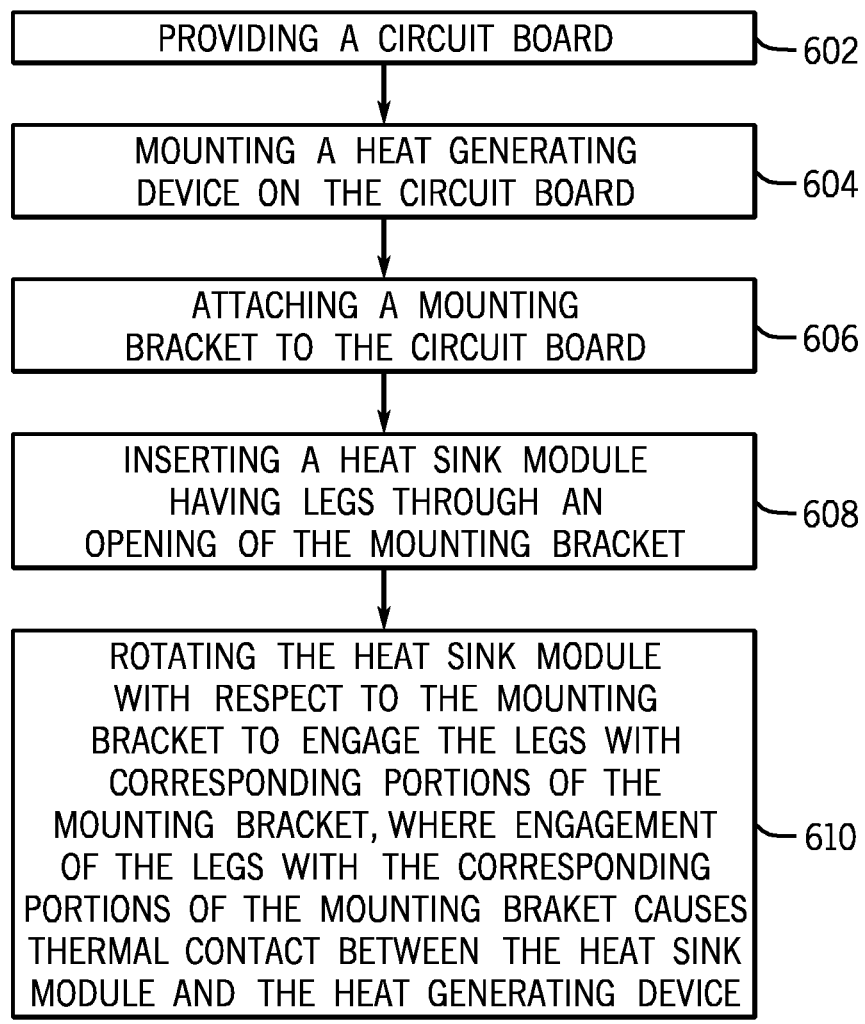
FIG. 6 is a flow diagram of a process of assembling an arrangement according to FIGS. 5A-5B, according to some implementations.

FIG. 6 is a flow diagram of a process of assembling an arrangement according to the example of FIGS. 5A-5B. The process of FIG. 6 provides (at 602) a circuit board. A heat generating device is mounted (at 604) on the circuit board. A mounting bracket is attached (at 606) to the circuit board.

The process inserts (at 608) a heat sink module having legs through an opening of the mounting bracket. The heat sink module is rotated (at 610) with respect to the mounting bracket to engage the legs with corresponding portions of the mounting bracket, where engagement of the legs with the corresponding portions of the mounting bracket causes thermal contact between the heat sink module and the heat generating device.

In the foregoing description, numerous details are set forth to provide an understanding of the subject disclosed herein. However, implementations may be practiced without some or all of these details. Other implementations may include modifications and variations from the details discussed above. It is intended that the appended claims cover such modifications and variations.

What is claimed is:

1. A heat sink module comprising:
a heat sink body having a heat dissipation element,
the heat sink body further including legs having respective engagement features for tool-less engagement with mounting structures of a circuit board, the engagement features engageable with respective pivotable engagement tabs of the mounting structures, each of the engagement features to be positioned with respect to a respective one of the engagement tabs when the respective engagement tab is lifted by user actuation to pivot from a first position to a second position, and each of the engagement features to engage the respective engagement tab that has been released to pivot from the second position to the first position,
wherein the engagement of the engagement features with the mounting structures is to mount the heat sink body to be in thermal contact with a heat generating device electrically mounted on the circuit board.

2. The heat sink module of claim 1, wherein the engagement features are for tool-less engagement with the mounting structures provided on a surface of the circuit board.

3. The heat sink module of claim 1, wherein the engagement features are for tool-less engagement with the mounting structures provided on a socket mounted on the circuit board, the socket to receive the heat generating device.

4. The heat sink module of claim 1, wherein the legs protrude laterally from sides of the heat sink body, and wherein the legs are either attached to the heat sink body or integrally formed with the heat sink body.

5. The heat sink module of claim 1, wherein each of the engagement features includes a receptacle to receive a corresponding one of the pivotable engagement tabs.

6. An apparatus comprising:
a fastener for attachment to a circuit board;
a pivotable engagement member pivotably mounted to the fastener, wherein the pivotable engagement member has a user-actuatable lever and an engagement head to be lifted from a first position to a second position in response to actuation of the user-actuatable lever, the second position to allow mounting of a heat sink module to thermally contact a heat generating device, and the first position to cause the engagement head to engage a leg of the heat sink module.

7. The apparatus of claim 6, wherein the fastener includes a screw.

8. The apparatus of claim 6, further comprising a spring to bias the engagement head to the first position.

9. The apparatus of claim 6, wherein the engagement head is shaped to fit into a receiving profile of the leg of the heat sink module.

10. The apparatus of claim 6, further comprising:
a second fastener for attachment to the circuit board; and
a second pivotable engagement member pivotably mounted to the second fastener, wherein the second pivotable engagement member has a user-actuatable lever and an engagement head to be lifted from a first position to a second position in response to actuation of the user-actuatable lever of the second pivotable engagement member.

11. A method comprising:
providing a circuit board;
mounting a heat generating device on the circuit board;
attaching a mounting bracket to the circuit board; and
after attaching the mounting bracket to the circuit board, inserting a heat sink module having legs through an opening of the mounting bracket and rotating the heat sink module with respect to the mounting bracket to engage the legs with corresponding portions of the mounting bracket, wherein engagement of the legs with the corresponding portions of the mounting bracket causes thermal contact between the heat sink module and the heat generating device.

12. The method of claim 11, wherein the legs have portions protruding laterally from sides of the heat sink module.

13. The apparatus of claim 9, wherein the receiving profile of the leg includes a receptacle.

14. A system comprising:
a circuit board including a heat generating device;
a heat sink module in thermal contact with the heat generating device; and
a mounting structure comprising:
a fastener attached to the circuit board; and
a pivotable engagement member pivotably mounted to the fastener,
wherein the pivotable engagement member has a user-actuatable lever and an engagement head to be lifted from a first position to a second position in response to actuation of the user-actuatable lever, the second position to allow mounting of the heat sink module to thermally contact the heat generating device, and the first position to cause the engagement head to engage a leg of the heat sink module.

15. The system of claim 14, wherein the fastener includes a screw.

16. The system of claim 14, further comprising a spring to bias the engagement head to the first position.

\* \* \* \* \*